United States Patent
Yoshii et al.

(10) Patent No.: US 8,633,116 B2
(45) Date of Patent: Jan. 21, 2014

(54) DRY ETCHING METHOD

(75) Inventors: Manabu Yoshii, Susono (JP); Kazuhiro Watanabe, Susono (JP)

(73) Assignee: Ulvac, Inc., Kanagawa (JP)

( * ) Notice: Subject to any disclaimer, the term of this patent is extended or adjusted under 35 U.S.C. 154(b) by 34 days.

(21) Appl. No.: 13/387,670

(22) PCT Filed: Jan. 25, 2011

(86) PCT No.: PCT/JP2011/051280
§ 371 (c)(1),
(2), (4) Date: Jan. 27, 2012

(87) PCT Pub. No.: WO2011/093258
PCT Pub. Date: Aug. 4, 2011

(65) Prior Publication Data
US 2012/0129278 A1 May 24, 2012

(30) Foreign Application Priority Data
Jan. 26, 2010 (JP) .................................. 2010-014792

(51) Int. Cl.
*H01L 21/302* (2006.01)
*H01L 21/461* (2006.01)

(52) U.S. Cl.
USPC ........... 438/706; 438/700; 438/719; 438/725; 438/733; 438/9; 257/E21.007; 257/E21.027; 257/E21.043; 257/E21.218; 257/E21.227; 257/E21.231; 257/E21.245; 257/E21.266; 257/E21.311

(58) Field of Classification Search
USPC ......... 438/706, 700, 725, 719, 733, 723, 724, 438/740, 769, 9, 513, 514; 257/E21.007, 257/E21.027, E21.043, E21.218, E21.227, 257/E21.231, E21.245
See application file for complete search history.

(56) References Cited

U.S. PATENT DOCUMENTS

| | | | |
|---|---|---|---|
| 6,187,685 B1 | 2/2001 | Hopkins et al. | |
| 6,620,737 B2 | 9/2003 | Saito et al. | |
| 8,480,912 B2 * | 7/2013 | Matsuda et al. | 216/67 |
| 2005/0014372 A1 | 1/2005 | Shimonishi et al. | |
| 2007/0131652 A1 | 6/2007 | Okune et al. | |

FOREIGN PATENT DOCUMENTS

| | | |
|---|---|---|
| JP | 10-163171 | 6/1998 |
| JP | 2003-037100 | 2/2003 |
| JP | 2006-148156 | 6/2006 |
| JP | 4090492 | 5/2007 |
| KR | 10-0194653 B1 | 2/1999 |
| KR | 10-2006-0108625 A | 10/2006 |
| WO | WO 03/056617 A1 | 7/2003 |

* cited by examiner

*Primary Examiner* — David Nhu
(74) *Attorney, Agent, or Firm* — Christensen Fonder P.A.

(57) ABSTRACT

A dry etching method includes a first step and a second step. The first step includes generating a first plasma from a gas mixture, which includes an oxidation gas and a fluorine containing gas, and performing anisotropic etching with the first plasma on a silicon layer to form a recess in the silicon layer. The second step includes alternately repeating an organic film forming process whereby an organic film is deposited on the inner surface of the recess with a second plasma, and an etching process whereby the recess covered with the organic film is anisotropically etched with the first plasma. When an etching stopper layer is exposed from a part of the bottom surface of the recess formed in the first step, the first step is switched to the second step.

15 Claims, 4 Drawing Sheets

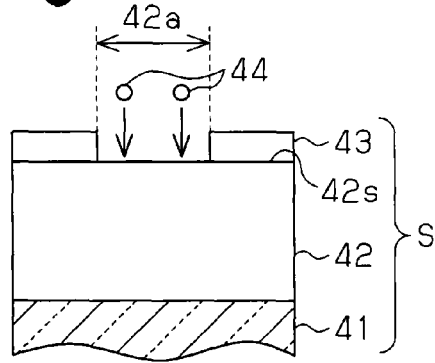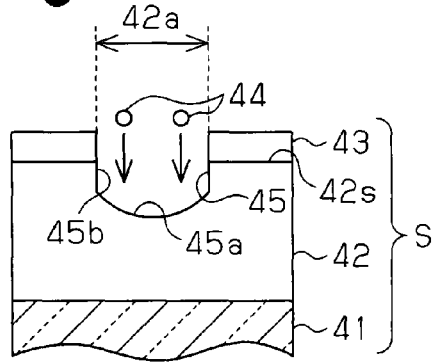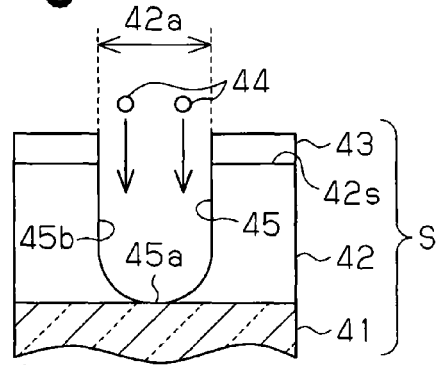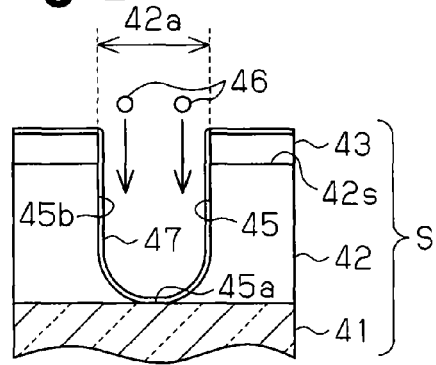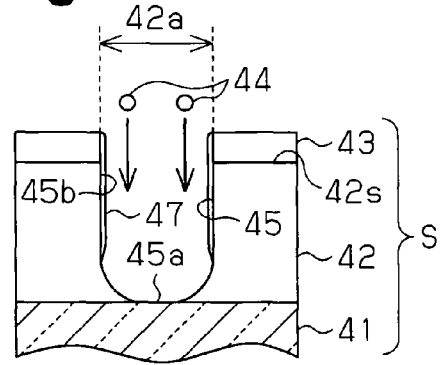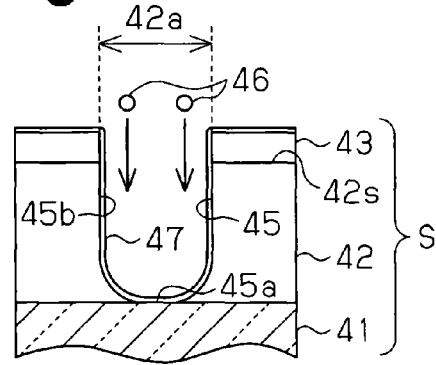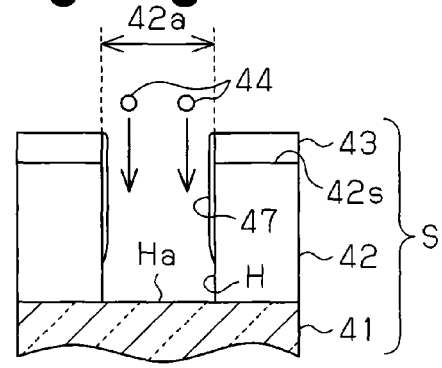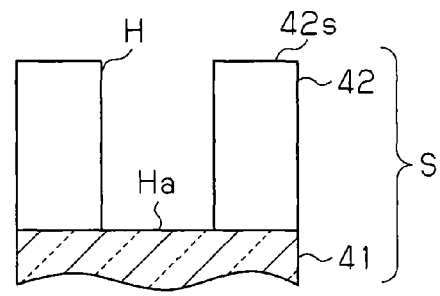

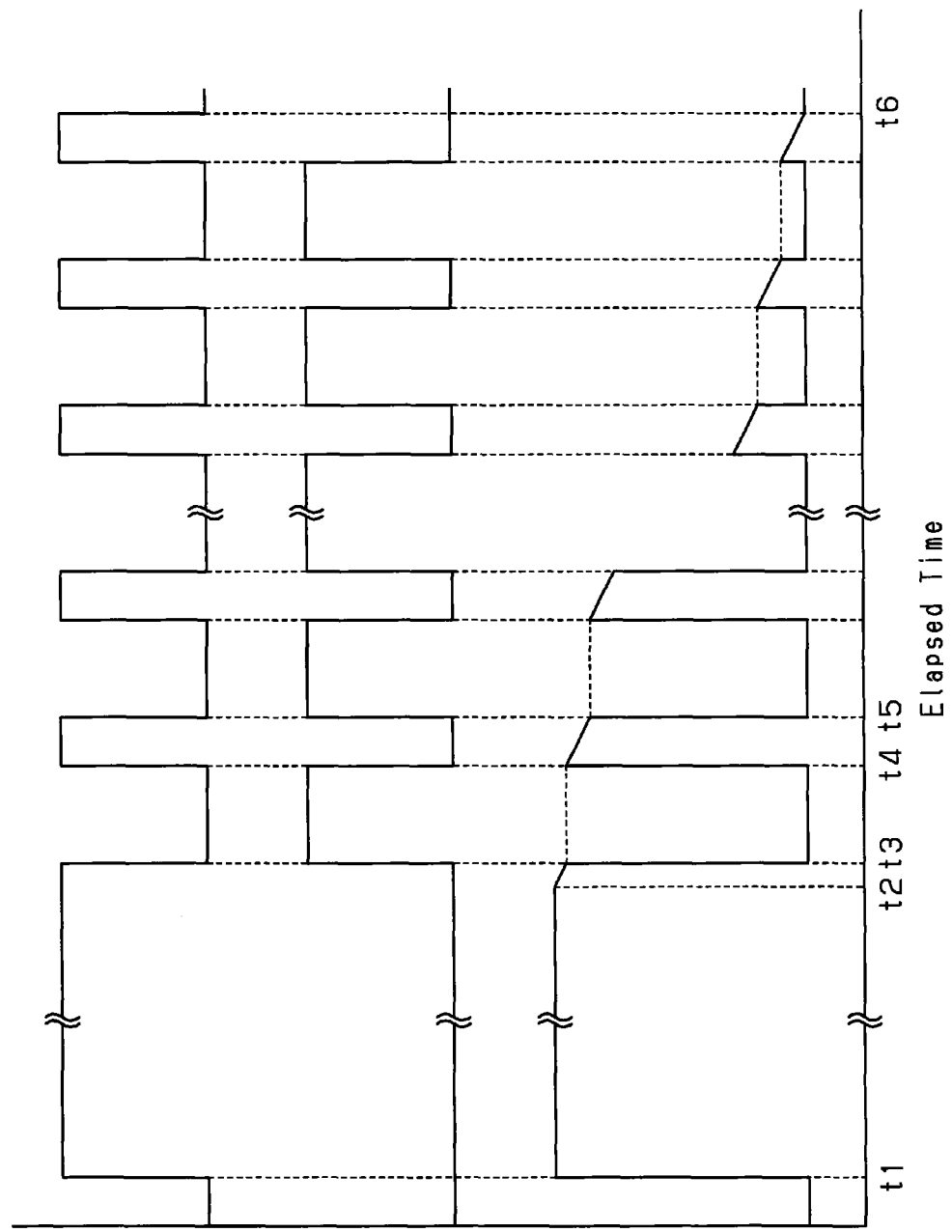

DRY ETCHING METHOD

RELATED APPLICATIONS

The present application is a National Phase entry of PCT Application No. PCT/JP2011/051280, filed Jan. 25, 2011, which claims priority from Japanese Patent Application Number 2010-014792, filed Jan. 26, 2010, the disclosures of which are hereby incorporated by reference herein in their entirety.

TECHNICAL FIELD

The present invention relates to a dry etching method, and more particularly, to an anisotropic etching method for etching a silicon layer.

BACKGROUND ART

In the prior art, when, for example, manufacturing a so-called MEMS device including miniaturized mechanical components and electronic components, dry etching is employed to etch silicon layers used in the MEMS device. Patent document 1 describes the employment of reactive dry etching to form a pattern of recesses, through holes, and the like in a silicon layer of the MEMS device. A dry etching method of the prior art will now be described with reference to FIG. 4 based on patent document 1.

As shown in FIG. 4(a), in the dry etching, plasma using sulfur hexafluoride ($SF_6$) gas, that is, an etchant 54 containing fluorine radicals (F*) and various types of positive ions is generated in a vacuum container, which accommodates a substrate S that is subject to processing. The substrate S includes a silicon layer 52, which forms an MEMS device. The silicon layer 52 is, for example, stacked on a silicon oxide layer 51, which is an etching stopper layer. An etching mask 53 is formed on a surface 52s of the silicon layer 52. The etching mask 53 is patterned to expose an etched region 52a of the silicon layer 52. Then, as shown in FIG. 4(b), the positive ions drawn into the substrate S by bias voltage applied to the substrate S and the fluorine radicals contacting the surface of the substrate S advances the etching reaction in the etched region 52a and forms a recess 55 in the etched region 52a.

The positive ions drawn into the substrate S advance etching in a thicknesswise direction of the silicon layer 52. However, the radicals that are not directive advances etching not only in the thicknesswise direction of the silicon layer 52 but also in a direction intersecting the thicknesswise direction. In the MEMS device, the thickness of the silicon layer 52 is tens of micrometers to hundreds of micrometers. Thus, when continuously performing isotropic etching with such radicals over the entire thickness of the silicon layer 52, the recess 55 formed in the silicon layer 52 may greatly extend not only in the thicknesswise direction of the silicon layer 52 but also in the direction intersecting the thicknesswise direction. With regard to such a problem, the dry etching method described in patent document 1 is performed in the following manner.

In this method, the etching reaction is temporarily stopped after the recess 55 is partially formed one in the thicknesswise direction of the silicon layer 52, as shown in FIG. 4(b). Then, as shown in FIG. 4(c), hydrocarbon trifuluoride ($CHF_3$) gas 56 is sent into the vacuum container to form a protective film 57 of polytetrafluoroethylene (($C_2F_2)_n$) over the entire surface of the substrate S including an inner surface of the recess 55. Subsequently, as shown in FIG. 4(d), sulfur hexafluoride gas is sent again into the vacuum container and plasmatized to resume etching in the thicknesswise direction of the silicon layer 52.

In this state, only the radicals mainly contact the protective film 57 formed on the side surface of the recess 55. In contrast, not only the radicals but also the positive ions contact the protective film 57 formed on the bottom surface of the recess 55. As a result, the removal of the protective film 57 with the etchant 54 is faster at the bottom surface of the recess 55 than at the side surface of the recess 55. Thus, the side surface of the recess 55 is protected by the protective film 57, whereas the bottom surface of the recess 55 is further etched in the thicknesswise direction of the silicon layer 52. Then, the etching step (FIG. 4(d)) using sulfur hexafluoride gas and the protective film forming step (FIG. 4(c)) using the hydrocarbon trifluoride gas 56 are alternately repeated until the bottom surface of the recess 55 reaches the surface of the silicon oxide layer 51. This forms a through hole H extending through the silicon layer 52, which has a thickness of tens of micrometers to hundreds of micrometers in the thicknesswise direction.

PRIOR ART DOCUMENT

Patent Document 1: Japanese Patent No. 4090492

SUMMARY OF THE INVENTION

When the through hole H is formed by repeating the etching step and the protective film forming step, the surface of the silicon oxide layer 51 under the silicon layer 52 becomes exposed in the final etching step. In this state, bias voltage is also applied to the silicon oxide layer 51. Thus, the positive ions in the etchant 54 are drawn into the exposed surface of the silicon oxide layer 51 in addition to the silicon layer 52.

In this case, the silicon oxide layer 51 is not etched by the etchant 54 derived from the sulfur hexafluoride gas. Thus, the surface of the silicon oxide layer 51, which is bombarded by positive ions is positively charged. In this manner, when the surface of the silicon oxide layer 51 is positively charged, at the vicinity of the surface of the silicon oxide layer 51, the advancing direction of the positive ion towards the silicon oxide layer 51 may deviate toward the side surface of the recess 55, that is, the silicon layer 52, as shown in FIG. 4(e). Thus, most of the positive ions advancing toward the bottom surface of the recess 55 move toward the side surface of the recess 55 during the final etching step in which the silicon oxide layer 51 is continuously exposed. The positive ions increase erosion in the side surface of the recess 55, and a notch 60 forms in the bottom (lower side surface) of the through hole H. That is, an opening Ha of the through hole H at the surface of the silicon oxide layer 51 becomes larger than the desired size. For instance, when the through hole H is used as an optical path for guiding light in the completed MEMS device, the desired light reflection at the opening Ha may not be obtained. This may adversely affect the functions of the MEMS device.

Such problem occurs not only when etching a silicon layer used in a MEMS device but also when etching a silicon layer having a thickness of tens of micrometers to hundreds of micrometers and stacked on an etching stopper layer, which is formed by a dielectric, through the dry etching method shown in FIG. 4.

Accordingly, it is an object of the present invention to provide a dry etching method capable of etching a silicon layer while suppressing undesired erosion of the silicon layer, that is, the generation of a notch, at a boundary of the silicon layer and an etching stopper layer.

One aspect of the present invention is a dry etching method. A method for performing dry etching, through a mask layer having an opening, on a substrate including a silicon layer arranged on an etching stopper layer, which is formed by a dielectric, includes a first step and a second step. The first step includes generating a first plasma from a gas mixture, which includes an oxidation gas that oxidizes the silicon layer and a fluorine containing gas, maintaining the substrate at a negative bias potential in the first plasma, and performing anisotropic etching with the first plasma on the silicon layer through the opening of the mask layer to form a recess in the silicon layer. The second step includes alternately repeating an organic film forming process and an etching process. The organic film forming process includes generating a second plasma, which is used to form an organic film that is removable with the first plasma, maintaining the substrate at a negative bias potential in the second plasma, and depositing the organic film on an inner surface of the recess with the second plasma. The etching process includes generating the first plasma from the gas mixture, maintaining the substrate at a negative bias potential in the first plasma, and performing the anisotropic etching with the first plasma on the recess covered by the organic film through the opening of the mask layer. The first step is shifted to the second step when the etching stopper layer is exposed from part of a bottom surface of the recess formed by the first step.

In the above method, in the first step, anisotropic etching is performed with a first plasma to form a recess in the silicon layer. The first plasma is generated from a gas mixture containing an oxidation gas, which oxidizes the silicon layer, and a fluorine containing gas. Accordingly, the fluorine containing gas etches the silicon layer while the oxidation gas protects the inner surface of the recess. That is, anisotropic etching is enhanced while isotropic etching, which uses radicals that are not directive, is suppressed. In the first step, when the etching stopper layer is exposed from part of the bottom surface of the recess, the first step is completed and the second step is started. In the second step, an organic film forming process, which is performed with a second plasma, and an anisotropic etching process, which uses the first plasma, are alternately repeated. Accordingly, after the etching stopper layer is exposed from part of the bottom surface of the recess, anisotropic etching is performed on the recess in a state in which the exposed part of the etching stopper layer is covered by an organic film. In this state, positive ions directed toward the bottom surface of the recess (etchant resulting from the first plasma) is used to remove the organic film covering the bottom surface of the recess. This suppresses positive charging of the etching stopper layer in the second step. Accordingly, undesirable erosion of the silicon layer, that is, the generation of a notch, at the boundary between the silicon layer and the etching stopper layer is suppressed in a preferable manner.

In the above dry etching method, the second step may alternately repeat the organic film forming process with the second plasma and the etching process with the first plasma for a number of times.

In this method, the recess that extends through the silicon layer can be properly formed, while suppressing the generation of a notch in a preferable manner in accordance with various conditions, such as the thickness of the silicon layer of the substrate, the size of the opening of the recess, and the etching process.

In the above dry etching method, the first step includes detecting exposure of the etching stopper layer from part of the bottom surface of the recess based on a change in the amount of an etching product produced when etching the silicon layer.

A dry etching process normally generates an etching produce through the reaction of an etchant, which is used for etching, with an etched subject. The generated amount of the etching product is indicative of a unique value that is in accordance with the etching conditions. For example, when the etching condition is a single etching condition, the generation reaction of the etching product occurs in a generally consistent state. Thus, the generation amount of the etching product is a constant value from when processing starts. When the etching conditions are changed, the generation reaction of the etching product occurs in an inconsistent state. Thus, the generation amount of the etching product increases or decrease in accordance with the etching conditions.

When the etching stopper layer is exposed from part of the bottom surface of the recess, some of the etchant directed toward the bottom surface of the recess hits the etching stopper layer instead of the silicon layer. Thus, in comparison to when all of the etchant directed toward the bottom surface of the recess hits the silicon layer, the amount of the etchant and the amount of the silicon layer used for an etching reaction is decreased. As a result, the amount of the etchant per unit time in a processing container increases, while the amount of the etching product per unit time in the processing container decreases. In other words, when the silicon layer that contacts the etchant decreases, the generation amount of the etching product changes accordingly.

In the above method, the exposure of the etching stopper layer from part of the bottom surface of the recess is detected in the first step based on changes in the generation amount of the etching product. Accordingly, exposure of the surface of the etching stopper layer to positive ions over a long period of time is suppressed, and the generation of a notch is suppressed in a preferable manner.

In the above dry etching method, the first step may include monitoring the amount of the etching product and detecting the exposure of the etching stopper layer from part of the bottom surface of the recess when the amount of the etching product decreases.

As described above, when the etching stopper layer is exposed from part of the bottom surface of the recess, some of the etchant directed toward the bottom surface of the recess hits the etching stopper layer instead of the silicon layer. This decrease the amount of the etching produced generated by the reaction of the silicon layer and the etchant.

In the above method, the exposure of the etching stopper layer from part of the bottom surface of the recess is detected in the first step from a decrease in the generation amount of the etching product. Thus, the exposure of the etching stopper layer is detected in a preferable manner. This suppresses positive charging of the exposed part of the etching stopper layer caused by a delay in the shifting of the first step to the second step and ultimately suppresses the generation of the notch in a preferable manner.

In the above dry etching method, the first step may include monitoring the amount of an etchant, which etches the silicon layer, and detecting exposure of the etching stopper layer from part of the bottom surface of the recess when the amount of the etchant increases.

As described above, when the etching stopper layer is exposed from part of the bottom surface of the recess, some of the etchant directed toward the bottom surface of the recess hits the etching stopper layer instead of the silicon layer. The etchant hitting the etching stopper layer is not used for an etching reaction and may remain in the processing container.

Alternatively, the etchant may hit other particles and then react with the silicon layer. However, in comparison to when being first used in an etching reaction, the etchant remains in the processing container for a longer time.

In the above method, the exposure of the etching stopper layer from part of the bottom surface of the recess is detected in the first step from an increase in the generation amount of the etching product. Thus, the exposure of the etching stopper layer is detected in a preferable manner. This suppresses positive charging of the exposed part of the etching stopper layer caused by a delay in the shifting of the first step to the second step and ultimately suppresses the generation of the notch in a preferable manner.

In the above dry etching method, the gas mixture includes a sulfur hexafluoride gas serving as the fluorine containing gas, an oxygen gas serving as the oxidation gas, and a hydrogen bromide gas. Further, the second plasma is generated from a carbon fluoride compound. Moreover, the organic film is formed as a polymer of the carbon fluoride compound.

In the above method, the sulfur hexafluoride gas is used as the raw material for fluorine radicals. The oxygen gas generates non-volatile oxide silicon fluoride in cooperation with the sulfur hexafluoride gas. The hydrogen bromide gas is used as the raw material for bromine ions that etch the silicon layer and generates oxide silicon bromide in cooperation with the oxygen gas. Thus, halide oxide silicon, such as oxide silicon fluoride and oxide silicon bromide, protects the side surface of the recess (silicon layer). Further, the etching of the bottom surface of the recess is enhanced by fluorine radicals and bromine ions. Thus the anisotropic etching is realized in a preferable manner.

The above method additionally forms the organic film with a polymer of a carbon fluoride compound. Thus, the organic film is removed in a preferable manner by the chemical etching and the physical etching performed by the etchant in the first plasma. Accordingly, the protective film 47 does not obstruct the advancement of the etching while protecting the recess from erosion in a suitable manner.

BRIEF DESCRIPTION OF THE DRAWINGS

FIGS. 2(a) to 2(h) are diagrams showing the steps for forming a through hole in a substrate subject to processing using the plasma etching method.

FIGS. 3(a), 3(b), and 3(c) are timing charts showing an etching gas and octafluoro cyclobutane gas supplying process and an etching product amount.

DESCRIPTION OF THE EMBODIMENTS

A dry etching method according to one embodiment of the present invention will now be described with reference to FIGS. 1 to 3. In this embodiment, a method for performing plasma etching on a silicon layer will be described.

Figure 1:
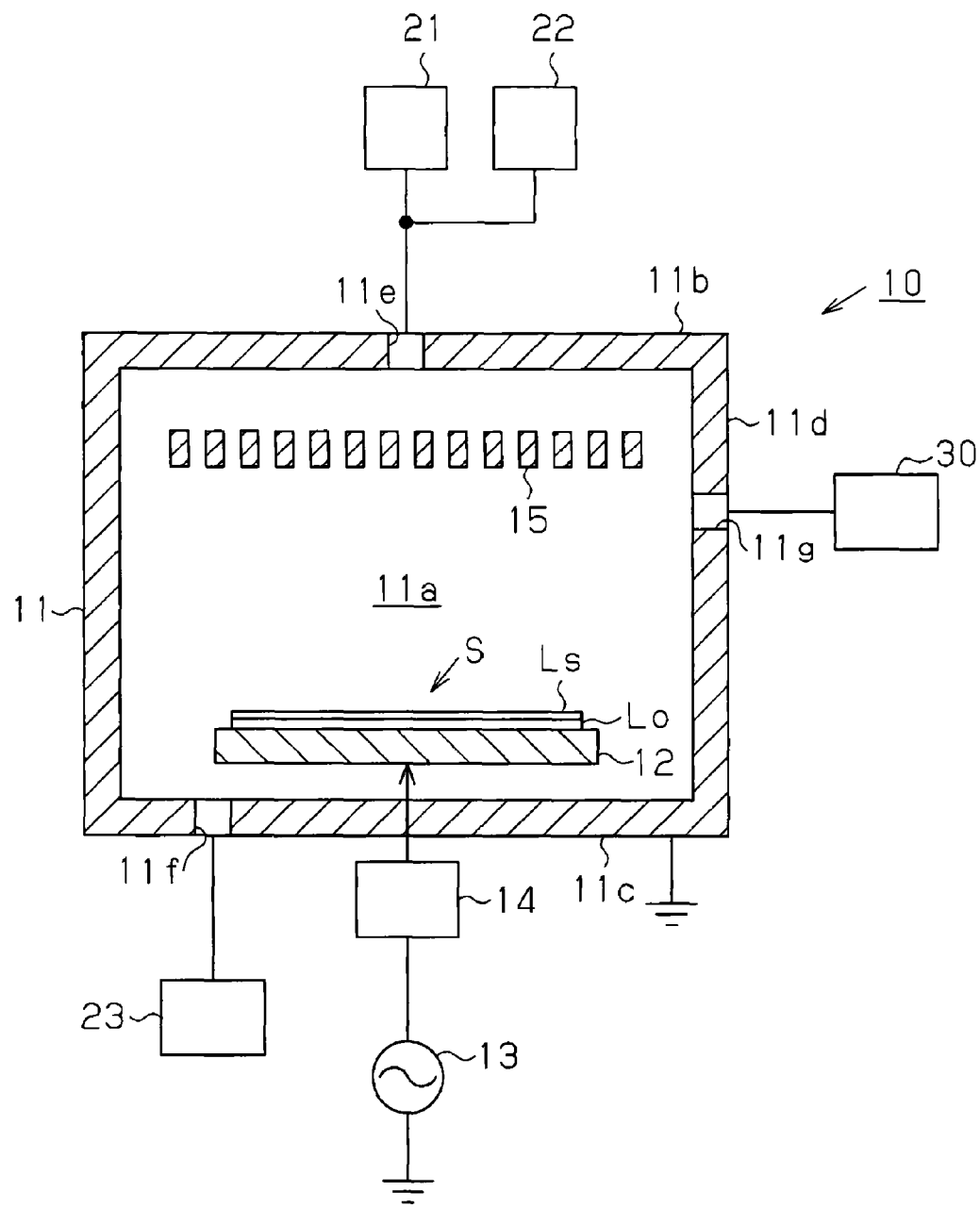
FIG. 1 is a schematic diagram showing a plasma etching device for performing a plasma etching method that is a dry etching method according to one embodiment of the present invention.

FIG. 1 schematically shows the structure of a plasma etching device that performs etching using the plasma etching method of the present embodiment. As shown in FIG. 1, a substrate stage 12, on which a substrate S that is subject to processing is placed, is arranged in a plasma generation region 11a formed in a vacuum container 11 of the plasma etching device 10. The substrate S is a substrate for an MEMS device, for example, and includes a silicon oxide layer Lo, which serves as an etching stopper layer, and a silicon layer Ls, which is stacked on the silicon oxide layer Lo. The substrate S is arranged on the substrate stage 12 with the silicon oxide layer Lo being located at the lower side.

A high frequency power supply 13 is connected to the substrate stage 12 to apply bias voltage to the substrate S placed on the substrate stage 12. A matching box 14 is connected between the substrate stage 12 and the high frequency power supply 13. The matching box 14 includes a matching circuit and a blocking capacitor. The matching circuit matches the impedance in the plasma generation region 11a, which becomes the load, and the transmission path from the high frequency power supply 13 to the substrate S. A shower plate 15 is arranged above the substrate stage 12 in the plasma generation region 11a. The shower plate 15 evenly diffuses the gas that becomes the raw material for the plasma of the etching process performed in the plasma generation region 11a.

An etching gas supplying unit 21 is connected to a gas inlet 11e formed in a top portion 11b of the vacuum container 11. The etching gas supplying unit 21 supplies the plasma generation region 11a with gas that becomes the raw material for plasma, for example, a gas mixture of sulfur hexafluoride ($SF_6$) gas, which is gas containing fluorine, oxidation gas ($O_2$), and hydrogen bromide (HBr) gas. In addition, a carbon fluoride compound gas supplying unit 22 is connected in the same manner to the gas inlet 11e to supply the plasma generation region 11a with a carbon fluoride compound gas, for example, octafluoro cyclobutane ($C_4F_8$) gas. A discharge unit 23, which is formed by a turbo molecular pump or the like, is connected to a discharge port 11f formed in a bottom portion 11c of the vacuum container 11 to discharge gas from the plasma generation region 11a.

A detection unit 30 is connected to a detection port 11g formed in a side portion 11d of the vacuum container 11 to detect the amount of the substances present in the plasma generation region 11a per unit time. When the plasma etching device 10 is performing the etching process, the product produced in the plasma generation region 11a, for example, the detection unit 30 detects the product produced by an etching reaction and the production amount of the etchant used in the etching reaction every second.

The plasma etching device 10 performs the etching process on the substrate S to form a through hole extending through the substrate S, particularly, the silicon layer Ls, in its thicknesswise direction to the silicon oxide layer Lo. In the etching process, the substrate S is first loaded into the vacuum container 11 from a loading port of the plasma etching device 10 and placed on the substrate stage 12. The etching gas amount adjusted by the etching gas supplying unit 21 is then sent into the gas inlet 11e and evenly diffused by the shower plate 15 in the plasma generation region 11a. When the etching gas is delivered in such manner, the pressure of the plasma generation region 11a is adjusted to a predetermined pressure by the discharge unit 23. The pressure in the plasma generation region 11a is maintained at a predetermined pressure during the etching process by the flow rate of the delivered gas and the discharge amount of the discharge unit 23.

After an etching gas atmosphere is formed in the plasma generation region 11a under a predetermined pressure, a high frequency power of 60 MHz, for example, is supplied from the high frequency power supply 13 to the substrate stage 12 via the matching box 14. This ionizes or dissociates the etching near the substrate stage 12 and generates plasma, near the substrate S, formed by various types of positive ions ($SF_x^+$) of sulfur fluoride (F*) positive ions of bromine (Br⁺), or radicals such as fluorine radicals (F*). The electrons in the plasma following the frequency of the high frequency power hits the entire surface of the substrate S, and the blocking capacitor in the matching box 14 functions so that the entire surface of the substrate S becomes a negative bias potential. The silicon layer Ls is etched when the positive ions and radicals react with the silicon layer Ls of the substrate S.

In addition to the above etching process, the plasma etching device 10 uses a gas supplied from the carbon fluoride compound gas supplying unit 22 to perform a process of forming a protective film in a recess formed in the silicon layer Ls by the etching process. The protective film is an organic film that can be removed by plasma. When the etching process and the protective film forming process (organic film forming process) are alternately repeated, a through hole is formed extending through the silicon layer Ls of the substrate S in the thicknesswise direction to the silicon oxide layer Lo.

The processing steps of the dry etching process performed to form a through hole in the substrate S will now be described in detail with reference to FIGS. 2 and 3. FIG. 2 shows the cross-sectional shape of the substrate S taken along a thicknesswise direction of the silicon layer 42 in the order of the forming steps of the through hole.

As shown in FIG. 2(a), the substrate S includes a silicon oxide layer 41, which includes a silicon oxide such as silicon dioxide, and a silicon layer 42, which includes silicon and which is stacked on the silicon oxide layer 41. An etching mask 43, which is a mask layer, is formed on a surface 42s of the silicon layer 42. The etching mask 43 is patterned to expose an etched region 42a of the silicon layer 42 that corresponds to a formation region of the through hole. The gas flow rate of the gas mixture, the pressure during the etching process, the output value of the high frequency power during the etching process, the gas flow rate of the carbon fluoride compound gas, the pressure during the protective film forming process, and the output value of the high frequency power during the protective film forming process in the following description are all examples of preferable values for the substrate S when the silicon layer 42 has a thickness of 100 μm and the etched region 42a, which is a circular hole, has a diameter of 50 μm.

When performing the dry etching process on the substrate S, the etching gas is first supplied from the etching gas supplying unit 21 to the vacuum container 11 that accommodates the substrate S. In the present embodiment, a gas mixture of sulfur hexafluoride ($SF_6$) gas, oxygen gas ($O_2$), and hydrogen bromide (HBr) gas is used as the etching gas. Such gases are delivered to the vacuum container 11 at flow rates of, for example, 75 sccm, 75 sccm, and 15 sccm, respectively in the order of sulfur hexafluoride gas, oxygen gas, and hydrogen bromide gas. More specifically, in the vacuum container 11, when the divided pressure of sulfur hexafluoride gas is $P_{SF}$, the divided pressure of oxygen gas is $P_O$, and the divided pressure of hydrogen bromide gas is $P_{HBr}$, the divided pressure ratio is "$P_{SF}:P_O:P_{HBr}=5:5:1$". When the gas mixture is delivered to the vacuum container 11 in such a manner, the discharge unit 23 is driven, and gas is discharged from the vacuum container 11 to obtain a predetermined pressure in the vacuum container 11 of, for example, 20 Pa.

The high frequency power of 60 MHz, for example, is then supplied from the high frequency power supply 13 to the substrate S at an output value of 1200 W via the matching box 14. This generates plasma with the gas mixture around the substrate stage 12 on which the substrate S is placed so that bias potential of the substrate S becomes negative. In addition to the fluorine radicals, which are an excited species of sulfur hexafluoride, the plasma contains various types of positive ions of sulfur fluorides (SF) and positive ions of bromine, which are excited species of hydrogen bromide. Such radicals and positive ions function as the etchant 44 that are directed toward the surface 42s (etched region 42a) of the silicon layer 42 exposed from the opening of the etching mask 43 to etch the silicon layer 42 from the surface 42s.

More specifically, the positive ions drawn into the surface 42s of the substrate S advance physical and chemical etching in the surface 42s of the substrate S. The fluorine radicals or bromine ions react with silicon (Si) and advance chemical etching in the surface 42s of the substrate S that generates a volatile silicon tetrafluoride ($SiF_4$) or a volatile silicon tetrabromide ($SiBr_4$). The etching performed by the positive ions is the so-called anisotropic etching and induced when positive ions are drawn substantially perpendicular to the substrate S by the bias potential, in which the etching advances in the direction perpendicular to the surface 42s of the silicon layer 42. The etching performed by the fluorine radials or bromine ions is isotropic etching that does not have directivity.

In the dry etching process of the present embodiment, oxygen gas is delivered to the plasma etching device 10 in addition to sulfur hexafluoride gas and hydrogen bromide gas to generate the etchant 44. Thus, the oxygen radicals (O*) derived from the oxygen gas react with the halides of the silicon described above and generates oxide silicon fluoride ($SiO_xF_y$) or oxide silicon bromide ($SiO_xBr_y$). The generating reaction of the oxide silicon fluoride and the oxide silicon bromide, which is one type of halide oxide silicon, occurs in the entire etched region 42a, which is the opening of the etching mask 43 so that the halide oxide silicon is deposited throughout the entire etched region 42a. The halide oxide silicon deposited on the etched region 42a of the silicon layer 42 is removed in the above-described etching in the same manner as the silicon layer 42, and the oxide silicon bromide, in particular, reacts with fluorine radicals and become volatile bromine fluoride silicon ($SiBr_xF_y$) to be removed from the silicon layer 42.

More specifically, in the present embodiment, the etching of the silicon layer 42 by the various types of excited species is advanced at the same time as the deposition of the halide oxide silicon, which is the reaction product of the excited species, the silicon, and the oxygen, on the silicon layer 42. When such dry etching process advances, the halide oxide silicon is deposited on the entire inner surface of a recess 45 when the recess 45 is formed in the thicknesswise direction of the silicon layer 42, as shown in FIG. 2(b).

In one example, the environment of the plasma generation region 11a is maintained so that the speed of the isotropic etching on the halide oxide silicon and the deposition speed of the halide oxide silicon are equal with respect to the bottom surface 45a of the recess 45 and the side wall 45b of the recess 45. That is, the amount of halide oxide silicon deposited on the bottom surface 45a of the recess 45 and the amount of halide oxide silicon deposited on the side wall 45b of the recess 45 are substantially the same, and the speed of the isotropic etching by the radicals, the ions, and the like is also substantially the same for the bottom surface 45a of the recess 45 and the side wall 45b of the recess 45. In this case, the etching speed at the bottom surface 45a of the recess 45 is increased by the positive ions in the recess 45 formed in the etched region 42a of the silicon layer 42. In particular, the etching speed becomes high at the middle of the bottom surface 45a where the entering probability of positive ions is higher than the periphery of the middle of the bottom surface 45a. In contrast, at the side wall 45b of the recess 45, the etching of the silicon layer 42 does not advance unless the etching of the halide oxide silicon deposited thereon is completed. As a result, the etching process performed on the etched region 42a forms the recess 45 depressed in the thicknesswise direction of the silicon layer 42 so that the middle of the bottom surface 45a is most depressed, as shown in FIG. 2(b).

In the present embodiment, the plasma state in the plasma generation region 11a and the bias potential of the substrate S, that is, the flow rate of various types of gases forming the gas mixture, the pressure of the plasma generation region 11a, the high frequency power supplied from the high frequency power supply 13, and the like are set based on experiments and the like conducted beforehand so that the anisotropic etching advances. Such etching conditions may be established, for example, by a single condition or by a plurality of different and successive conditions.

As such anisotropic etching advances, the silicon oxide layer 41, which is the underlayer of the silicon layer 42, is eventually exposed from part of the bottom surface 45a of the recess 45 that extends perpendicular to the thicknesswise direction of the silicon layer 42, as shown in FIG. 2(c). In this case, the silicon oxide layer 41 is exposed from the portion at which the anisotropic etching tends to advance most at the bottom surface 45a, that is, the middle of the bottom surface 45a where the entering probability of the positive ions is the highest. The exposed portion of the silicon oxide layer 41 is positively charged when hit by the positive ions, which is one of the etchant 44.

In this manner, when the etching of the silicon layer 42 is advanced until the silicon oxide layer 41 is exposed from part of the bottom surface 45a of the recess 45, the supply of the gas mixture from the etching gas supplying unit 21 to the substrate S is stopped. Then, as shown in FIG. 2(d), the supply of the carbon fluoride compound gas, for example, the octafluoro cyclobutane gas 46 from the carbon fluoride compound gas supplying unit 22 is started. The octafluoro cyclobutane gas 46 is supplied to the vacuum container 11 at a flow rate of 80 sccm, for example. After the octafluoro cyclobutane gas 46 is delivered to the vacuum container 11 in such a manner, the gas in the vacuum container 11 is discharged so that the interior of the vacuum container 11 becomes a predetermined pressure, for example, 40 Pa. The high frequency power of 60 MHz, for example, is then supplied from the high frequency power supply 13 to the substrate S at the output value of 600 W via the matching box 14. This generates plasma containing the octafluoro cyclobutane gas 46 near the substrate S.

In the plasma generated in such a manner, the radicals of carbon fluorides ($C_xF_y^*$) and their clusters are generated as the excited species. The excited species are polymerized on the entire inner surface of the recess 45 formed in the substrate S to form a protective film 47, which is a film of carbon fluoride compound (CF). In this case, the electrons in the plasma generated following the frequency of the high frequency power hits the entire surface of the substrate S including part (exposed portion) of the silicon oxide layer 41 that is positively charged. This neutralizes the positive charges remaining in the silicon oxide layer 41. Further, due to the action of the blocking capacitor in the matching box 14, the entire surface of the substrate S becomes a negative bias potential again. In this case, the positive ions following the frequency of the high frequency power are not contained in the plasma of the octafluoro cyclobutane gas 46. Thus, the substrate S continues to be negatively charged. As a result, the excited species advances the production of the protective film 47 even on the silicon oxide layer 41, which is electrostatically neutral or negatively charged. The middle of the bottom surface 45a including the silicon oxide layer 41 is the portion at which the excited species enters in the easiest manner, that is, the portion at which the entering probability of the excited species is the highest. Accordingly, the protective film 47 has the densest film structure or the greatest film thickness at the middle of the bottom surface 45a. The CF protective film 47, which is an organic film having a carbon backbone has a composition that can be removed by the plasma of the gas mixture.

After such forming process of the protective film 47 is performed for 20 seconds, the supply of the octafluoro cyclobutane gas 46 is stopped and the gas mixture is supplied again from the etching gas supplying unit 21 (FIG. 1), as shown in FIG. 2(e). The flow rates of the sulfur hexafluoride gas, the oxygen gas, and the hydrogen bromide gas contained in the gas mixture is 75 sccm, 75 sccm, 15 sccm, respectively. When the gas mixture is supplied, the gas in the vacuum container 11 is discharged so that the interior of the vacuum container 11 becomes a predetermined pressure, for example, 20 Pa. The high frequency power of 60 MHz, for example, is then supplied from the high frequency power supply 13 to the substrate S at an output value of 1200 W via the matching box 14. The protective film 47 or the CF polymerized film is removed from the inner surface of the recess 45 by the anisotropic etching performed using the positive ions of the sulfur fluorides, which is the excited species of the sulfur hexafluoride gas, and the oxygen ions as the etchant 44, and the isotropic etching also performed using the fluorine radicals or the excited species of the sulfur hexafluoride gas and the oxygen radicals as the etchant 44.

In this case, the protective film 47 covering the bottom surface 45a of the recess 45 is removed through anisotropic etching, which is performed by the positive ions, and the isotropic etching, which is performed by the radicals. In particular, the protective film 47 is rapidly removed at the portion at which the entering probability of the positive ions is high or the portion of the film structure that is easily etched by the positive ions. At the middle of the bottom surface 45a, the film structure of the protective film 47 has high etching resistance or large film thickness but the entering probability of positive ions is high. In comparison, at the periphery of the middle of the bottom surface 45a, the film structure of the protective film 47 has a lower etching resistance and a thinner film thickness than the protective film 47, which is formed at the middle, but the entering probability of the positive ions is lower than the middle. Thus, the speed at which the protective film 47 is removed becomes substantially the same at the middle of the bottom surface 45a and the periphery of the middle of the bottom surface 45a or is slightly slower at the periphery of the middle of the bottom surface 45a. In other words, the substantially entire bottom surface 45a is exposed at the same timing or the middle of the bottom surface 45a is exposed slightly in advance. The protective film 47 easily remains at the side wall 45b of the recess 45 at which the isotropic etching dominantly advances compared to the bottom surface 45a. As a result, the protective film 47 is removed substantially along the entire bottom surface 45a before the side wall 45b, and the etching of the silicon layer 42 remaining at the periphery of the middle of the bottom surface 45a continuously advances.

When the etching again advances in such a manner, the area proportion of the silicon oxide layer 41 exposed at the bottom surface 45a of the recess 45 gradually increases while protecting the side wall 45b of the recess 45. The silicon oxide layer 41 exposed at the middle of the bottom surface 45a again starts to be positively charged as etching advances in the silicon layer 42 remaining at the periphery of the middle of the bottom surface 45a. However, during the formation of the protective film 47, the positive charges remaining in the silicon oxide layer 41 are neutralized or the substrate S is negatively charged so that the timing the positive charges start to accumulate in the silicon oxide layer 41 is substantially the same or later than the timing the etching of the silicon layer 42 starts again. Thus, the amount of positive charge in the silicon oxide layer 41 is greatly reduced when the etching starts compared to when the etching process is continued without forming the protective film 47. Thus, most of the positive ions hit the silicon oxide layer 41 and loses its etching ability such that the etching reaction does not advance at the side wall 45b of the recess 45 even if the positive ions are advanced toward the exposed portion of the silicon oxide layer 41.

The recess 45 is most depressed at the middle of the bottom surface 45a even if the positive ions advanced toward the silicon oxide layer 41 are deviated from the silicon oxide layer 41. Thus, the etching with such positive ions contributes to the etching of the silicon layer 42 of the bottom surface 45a. Hence, the silicon layer 42 of the bottom surface 45a continues to be etched along the thicknesswise direction of the silicon layer 42. Namely, the silicon layer 42 continues to be etched along the thicknesswise direction since (A) the timing at which the positive charges start to accumulate in the silicon oxide layer 41 is substantially the same as or later than the timing at which the etching of the silicon layer 42 starts, and (B) the recess 45 is most depressed at the middle of the bottom surface 45a. In the present embodiment, the time of the etching process is set to the time in which the protective film 47 formed on the side wall 45b of the recess 45 remains and the etching of the silicon layer 42 of the side wall 45b does not advance, for example, ten seconds.

After the etching process that lasts for ten seconds is completed, the supply of the etching gas from the etching gas supplying unit 21 is stopped, as shown in FIG. 2(f), and the octafluoro cyclobutane gas 46 is supplied from the carbon fluoride compound gas supplying unit 22 to form the protective film 47 again on the inner surface of the recess 45 in the same manner as in FIG. 2(d). That is, in the present embodiment, the second step of alternately repeating the protective film forming process for covering the inner surface of the recess 45 with the protective film 47, as shown in FIGS. 2(d) and 2(f), and the etching process using the gas mixture, as shown in FIG. 2(e), is performed after the first step of performing the etching process of the silicon layer 42 using the gas mixture shown in FIGS. 2(a) to 2(c).

In the second step, the protective film forming process and the etching process are repeated, for example, for 25 times. During this period, the silicon oxide layer 41 exposed at the bottom surface 45a is positively charged by the preceding etching process, but the positive charges in the silicon oxide layer 41 are neutralized in the following forming process of the protective film 47. When the etching process and the protective film forming process are repeated with the protective film 47 remaining on the side wall 45b of the recess 45, the silicon layer 42 is entirely etched at the bottom surface 45a, as shown in FIG. 2(g). This forms the through hole H extending through the silicon layer 42 in the thicknesswise direction. The through hole H has an opening Ha corresponding to the exposed surface of the silicon oxide layer 41. The opening of the surface 42s of the silicon layer 42 and the opening Ha of the through hole H for exposing the silicon oxide layer 41 have substantially the same shape. That is, the through hole H formed in the silicon layer 42 has substantially the same shape in a cross-section parallel to the surface 42s of the silicon layer 42 at any position in the thicknesswise direction of the silicon layer 42.

When the through hole H extending through the silicon layer 42 in the thicknesswise direction is formed, the etching mask 43 stacked on the silicon layer 42 and the protective film 47 remaining on the inner surface of the through hole H are removed, as shown in FIG. 2(h).

In the present embodiment, when forming the through hole H as described above, the amount of reaction product of the dry etching process, in particular, silicon tetrafluoride or silicon tetrabromide in the gas phase of the vacuum container 11 is detected by the detection unit 30 from when the dry etching process of the silicon layer 42 starts. The shifting of the production amount of the etching product having volatile property and the supplying process of the etching gas and the octafluoro cyclobutane gas, which is the raw material of the protective film 47, will now be described with reference to FIG. 3.

FIG. 3 shows the supplying process of the etching gas and the octafluoro cyclobutane gas to the vacuum container 11 and the shifting of the existing amount of the volatile etching product in the vacuum container 11. As shown in FIG. 3(a), when the first step or the etching step of the silicon layer 42 is started at timing t1, a volatile etching product exists in the vacuum container 11 due to the reaction between the silicon layer 42 and the fluorine radical or the reaction between the silicon layer 42 and the bromine ion, as shown in FIG. 3(c). In this case, the octafluoro cyclobutane gas or the raw material for forming the protective film 47 is not supplied, as shown in FIG. 3(b).

When the dry etching process is performed, the gas mixture is supplied to the vacuum container 11 under a constant condition, and gas is discharged from the vacuum container 11 under a constant condition. This maintains the interior of the vacuum container 11 under a predetermined pressure. Thus, if the amount of etching product per unit time is constant, that is, if the etching speed is constant, the amount of etching product in the vacuum container 11 remains constant throughout the dry etching process. For instance, as shown in FIGS. 2(a) and 2(b), the amount of etchant 44 that hits the etched region 42a of the silicon layer 42 per unit time and the amount of silicon that reacts with the etchant 44 are considered to be substantially the same when the recess 45 is formed by etching only the silicon layer 42. Thus, the amount of etching product in the vacuum container 11 remains substantially constant.

When the etching of the silicon layer 42 in the first step advances, and the silicon oxide layer 41, which is the underlayer of the silicon layer 42, is exposed from part of the bottom surface 45a of the recess 45 (timing t2), the amount of etching product produced by the etching reaction of the silicon layer 42 decreases, as shown in FIG. 3(c). This is because the etchant 44 that does not react with the silicon layer 42 in the etched region 42a when the silicon oxide layer 41 is exposed from part of the bottom surface 45a. That is, the production amount of the volatile etching product decreases when the amount of the silicon layer 42 per unit time supplied for the etching reaction with the etchant 44 decreases. Thus, once the silicon oxide layer 41 is exposed, the area of the silicon oxide layer 41 exposed from the bottom surface 45a of the recess 45 enlarges as the etching of the silicon layer 42 advances. This decreases the amount of the silicon layer 42 per unit time that reacts with the etchant 44. Thus, the amount of the etching product in the vacuum container 11 also gradually decreases.

In the present embodiment, the amount of the etching product existing in the gas phase of the vacuum container 11 is detected and monitored by the detection unit 30 from when the formation of the through hole H starts in the silicon layer 42, as described above. The amount of etching product starts to decrease from when the silicon oxide layer 41 is exposed from part of the bottom surface 45a of the recess 45 in the silicon layer 42. Thus, the point of time when a decrease in the amount of etching product is detected can be understood as the timing at which the silicon oxide layer 41 starts to be exposed from part of the bottom surface 45a of the recess 45.

Figure 4A:
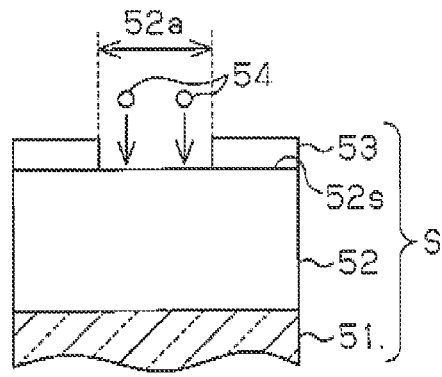
FIGS. 4(a) to 4(e) are diagrams showing the steps for forming a through hole in a substrate employing a plasma etching method of the prior art.
Figure 4B:
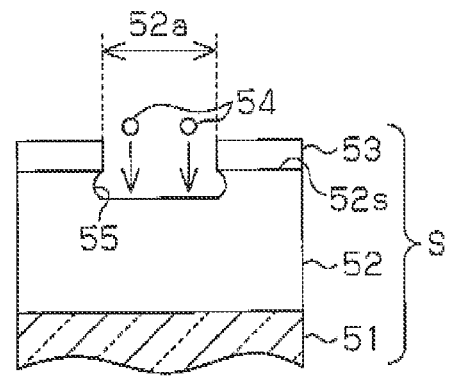
Figure 4C:
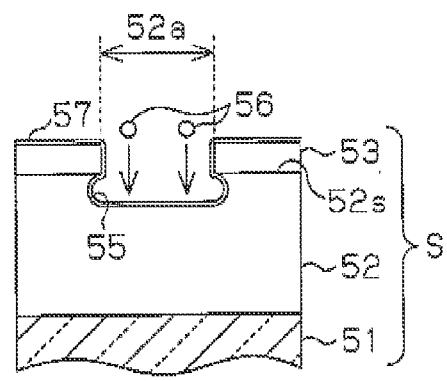
Figure 4D:
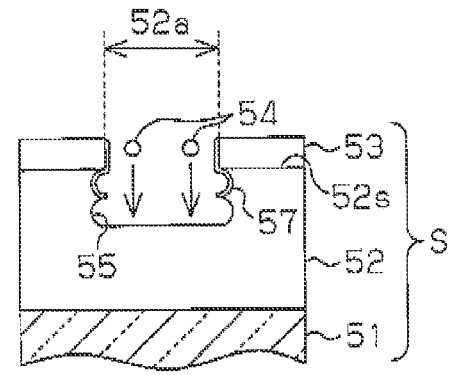
Figure 4E:
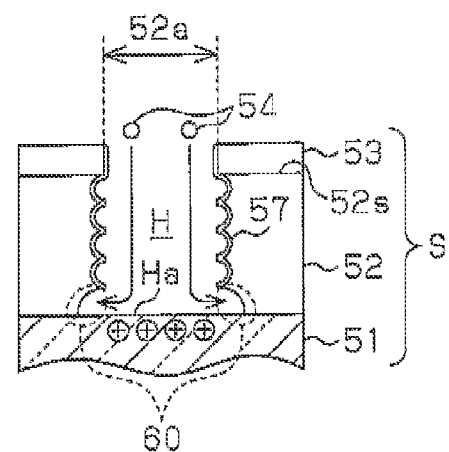

As shown in FIG. 4(e), when the dry etching process is continuously performed until the formation of the through hole H is completed even after part of the silicon oxide layer 51 is exposed from the bottom surface of the recess 55 formed by the dry etching process, the etchant 54 hits the silicon oxide layer 51 and the silicon oxide layer 51 is positively charged. The positive charge of the silicon oxide layer 51 changes the path of the etchant 54, in particular, the positive ions directed perpendicularly toward the substrate S so as to be directed toward the silicon layer 52 forming the side wall of the through hole H near the surface of the silicon oxide layer 51. The opening Ha of the through hole H is enlarged, that is, the notch 60 is formed by the etchant 54 in which the path is changed.

In the present embodiment, when the detection unit 30 determines that a predetermined reduction tendency is found in the amount of etching product after the silicon oxide layer 41 is exposed at timing t2, it is then determined that part of the silicon oxide layer 41 is exposed from the bottom surface 45a of the recess 45 (timing t3). The supply of the etching gas from the etching gas supplying unit 21 is stopped and the supply of the octafluoro cyclobutane from the carbon fluoride compound gas supplying unit 22 is started at the timing at which such determination is made. That is, the first step is shifted to the second step at timing t3.

The shifting timing from the first step to the second step after the silicon oxide layer 41 is exposed from part of the bottom surface 45a is appropriately selected based on results obtained beforehand such as the designed dimension of the through hole H, the shape of the recess 45 obtained in the first step, the film structure and the step covering property of the protective film 47, the etching shape of the protective film 47 obtained in the second step, and the like. For instance, if the diameter of the through hole H is small and the through hole G is shallow, the structure of the above (B) is difficult to obtain in the recess 45 and the shifting timing from the first step to the second step is thus preferably advanced. If the diameter of the through hole H is large and the through hole H is deep, the structure of the above-described (B) is easily obtained in the recess 45 and the shifting timing from the first step to the second step is thus preferably delayed. For instance, if the etching resistance property of the protective film 47 becomes high around the middle of the bottom surface 45a, the state of the above-described (A) is easily obtained, and the shifting timing from the first step to the second step is thus preferably delayed.

The octafluoro cyclobutane is then supplied to form the protective film 47 on the inner surface of the recess 45 during timing t3 to timing t4. At timing t4, the supply of the octafluoro cyclobutane is stopped, and the supply of the etching gas is restarted. For instance, the period from timing t3 to timing t4 is set to be two times greater than the period from timing t4 to timing t5 at which the supply of the etching gas is stopped.

In this manner, when forming the through hole H that extends from the silicon layer 42 to the silicon oxide layer 41 in the substrate S, the first step of performing the dry etching process is shifted to the second step of alternately repeating the protective film forming process and the dry etching process at timing t3. Thus, part of the silicon oxide layer 41 exposed from the bottom surface 45a of the recess 45 is etched by the gas mixture while being covered by the protective film 47 beforehand. Hence, in the dry etching process performed after the protective film 47 is formed, the silicon layer 42 remaining in the etched region 42a is removed while the protective film 47 formed on the bottom surface 45a is removed.

The silicon in the etched region 42a of the silicon layer 42 is completely removed and the through hole H having an opening Ha is formed in the silicon oxide layer 41 by alternately repeating the protective film forming process and the dry etching process (timing t6: FIG. 3(c)).

The dry etching method of the present embodiment has the advantages described below.

(1) The etching of the silicon layer 42 is started by the anisotropic etching using the plasma generated from the gas mixture including the sulfur hexafluoride gas used for the etching of the silicon layer 42 and the oxygen gas for oxidizing the silicon layer 42. When at least one part of the silicon oxide layer 41 is exposed from the bottom surface 45a of the recess 45, the process of covering the inner surface of the recess 45, which is formed by etching, with the protective film 47 and the etching process are alternately performed. In this manner, by performing etching on the silicon layer 42 with the sulfur hexafluoride gas while protecting the inner surface of the recess 45 with the oxygen gas, the isotropic etching with the radicals, which are not directional, is suppressed. This advances anisotropic etching. In addition, after the silicon oxide layer 41 is exposed from part of the bottom surface 45a of the recess 45, the etching of the silicon layer 42 is performed with the exposed region covered by the protective film 47. Since positive ions directed toward the surface of the silicon oxide layer 41 are used to remove the protective film 47 formed on the bottom surface 45a of the recess 45, the surface of the silicon oxide layer 41 is suppressed from being positively charged. Therefore, the generation of a notch at the bottom of the through hole H is suppressed.

(2) When the silicon oxide layer 41 is exposed from part of the bottom surface 45a of the recess 45 in the silicon layer 42, the amount of the etching product produced in the first step changes. When the detection unit 30 detects such change, the first step is terminated and the second step is started. Thus, the surface of the silicon oxide layer 41 is suppressed from being exposed over a long period to positive ions, and the generation of a notch is suppressed.

(3) The detection unit 30 detects and monitors the amount of etching product produced in the first step and detects decreases in the etching product. This determines exposure of the silicon oxide layer 41 from part of the bottom surface 45a of the recess 45. Thus, the exposure of part of the silicon oxide layer 41 is properly detected. Therefore, the exposed portion of the silicon oxide layer 41 is suppressed from being positively charged by delaying the shifting from the first step to the second step and the generation of the notch is ultimately suppressed.

(4) The gas mixture includes the sulfur hexafluoride gas, the oxygen gas, and the hydrogen bromide gas. The sulfur hexafluoride gas is used as the raw material for the fluorine radicals that etch the silicon layer 42. The oxygen gas generates the non-volatile oxide silicon fluoride in cooperation with the sulfur hexafluoride gas. The hydrogen bromide gas is used as the raw material of the bromine ion for etching the silicon layer 42 and generates the oxide silicon bromide in cooperation with the oxygen gas. Thus, the side surface of the recess 45 formed on the silicon layer 42 is protected by a halide oxide silicon such as the oxide silicon fluoride and the oxide silicon bromide. Further, the anisotropic etching is realized in a preferable manner since the etching of the bottom surface 45a of the recess 45 is enhanced by the fluorine radicals and the bromine ions.

(5) A polymer of the carbon fluoride compound is formed as the protective film 47 with the octafluoro cyclobutane ($C_4F_8$), which is a carbon fluoride compound, as raw material gas. Thus, the protective film 47 is removed in a preferable manner by the chemical etching and the physical etching by performed by the etchant 44 in the plasma of the gas mixture. Accordingly, the protective film 47 does not obstruct the advancement of the etching while protecting the recess 45 from erosion in a suitable manner.

The embodiment described above may be modified in the following manner.

The plasma etching device 10 is a so-called capacitance coupling type etching device that induces plasma with the high frequency power applied to the substrate stage 12. The present invention is not limited in such a manner. For example, an electrode facing the substrate stage 12 may be arranged in the vicinity of the top portion 11b of the vacuum container 11, and high frequency power may be applied to the electrode.

The plasma etching device 10 may include a high frequency antenna mounted on the top portion 11b of the vacuum container 11 or arranged along the outer peripheral surface of the side portion 11d of the vacuum container 11, and the plasma may be induced in the vacuum container 11 by applying high frequency power to the high frequency antenna. That is, the present invention may employ a so-called inductive coupling type plasma etching device.

Further, if the inductive coupling type device is employed as the plasma etching device, for example, a magnetic field coil may be arranged along the outer peripheral surface of the side portion 11d of the vacuum container 11 to form a region in which the magnetic field becomes zero inside the vacuum container.

The etching gas is not limited to the above-described gas mixture, that is, the gas mixture of sulfur hexafluoride gas, oxygen gas, and hydrogen bromide gas, and may be a gas mixture including oxidation gas for oxidizing the silicon layer and the fluorine containing gas as long as a recess extending in the direction of the thickness of the silicon layer can be formed. For instance, iodine pentafluoride gas, which is a fluorine containing gas, may be used in lieu of sulfur hexafluoride gas. Ozone gas, which is an oxidation gas, may be used in lieu of the oxygen gas. Further, the hydrogen bromide gas may be omitted.

In addition to sulfur hexafluoride gas, oxygen gas, and hydrogen bromide gas, the gas mixture may contain other gases, for example, a fluorine containing gas other than the sulfur hexafluoride gas or an oxidation gas other than the oxygen gas.

When forming the protective film 47, the gas that becomes the raw material thereof is not limited to octafluoro cyclobutane gas and may be octafluoro propane gas or the like. It is only required that a carbon fluoride compound gas capable of forming an organic film be removed by the etching gas.

The conditions related to the dry etching process in the first step and the second step and the conditions related to the forming process of the protective film 47 in the second step are not limited to those described above and may be appropriately changed in accordance with the thickness of the silicon layer 42 in the substrate S, the size of the through hole H formed in the silicon layer 42, and the conditions related to the etching process.

In the second step, the forming process of the protective film 47 and the dry etching process are alternately repeated 25 times. However, the present invention is not limited in such a manner, and the number of repeated times can be changed in accordance with the thickness of the silicon layer 42 in the substrate S, the size of the through hole H formed in the silicon layer 42, or the conditions related to the etching process.

The detection unit 30 detects and monitors the amount of volatile etching product existing in the vacuum container 11 and shifts from the first step to the second step when the amount of etching product decreases. However, the present invention is not limited in such a manner, and the detection unit 30 may detect the amount of the etchant 44 that etches the silicon layer 42.

When the etching of the silicon layer 42 in the first step is advanced, and the silicon oxide layer 41, which is the underlayer of the silicon layer 42, is exposed from part of the bottom surface 45a of the recess 45, the amount of the etchant 44 for etching the silicon layer 42 increases. This is because the etchant 44 that does not react with the silicon layer 42 generated in the etched region 42a when the silicon oxide layer 41 is exposed at the bottom surface 45a of the recess 45. That is, the etchant 44 is directed toward the substrate S from the etching gas supplying unit 21 of the vacuum container 11 but hits the silicon oxide layer 41 and returned to the etching gas supplying unit 21 of the vacuum container 11. Thus, once the silicon oxide layer 41 is exposed, the area of the silicon oxide layer 41 exposed from the bottom surface 45a of the recess 45 enlarges as the etching of the silicon layer 42 advances, and the amount of the etchant 44 per unit time that reacts with the silicon layer 42 decreases. This gradually increases the amount of the etchant 44 in the vacuum container 11.

Due to the reasons described above, the first step may be shifted to the second step when the detection unit 30 detects an increase in the amount of the etchant 44 in the vacuum container 11. In this case, the shifting of steps takes place when the silicon oxide layer 41 is exposed from the bottom surface 45a of the recess 45 formed in the silicon layer 42. This obtains the following advantage in lieu of advantage (3), which is described above.

(6) The detection unit 30 monitors the amount of the etchant 44 for etching the silicon layer 42 in the first step and detects an increase in the amount of the etchant 44. The detection determines that the silicon oxide layer 41 is exposed from part of the bottom surface 45a of the recess 45. This allows for exposure of part of the silicon oxide layer 41 to be properly determined. The exposed portion of the silicon oxide layer 41 is suppressed from being positively charged by a delay in the shifting from the first step to the second step and the generation of a notch is ultimately suppressed.

The first step is shifted to the second step when the amount of etching product in the vacuum container 11 is decreased. The present invention is not limited in such a manner, and the time from when the dry etching process starts to when the silicon oxide layer 41 is exposed from part of the bottom surface 45a in the recess 45 may be measured through experiments and the like beforehand, and the period for performing the first step may be set accordingly so that the shifting to the second step occurs when this period elapses.

In the first step and second step, the etching conditions such as the flow rate of the gas mixture, the pressure, and the output value of the high frequency power are single conditions. However, a plurality of different etching conditions may be continuously performed in at least either one of the steps.

The etching stopper layer, which is a dielectric, may be formed from a silicon nitride, a silicon oxide nitride layer, or a lamination of these substances instead of the silicon oxide layer 41 and may be various types of dielectric layers that ensure adhesion with the silicon layer 42.

The invention claimed is:

1. A method for performing dry etching, through a mask layer having an opening, on a substrate including a silicon layer arranged on an etching stopper layer, the etching stopper layer formed by a dielectric, the method comprising:
    a first step of generating a first plasma from a gas mixture including an oxidation gas that oxidizes the silicon layer and a fluorine containing gas, maintaining the substrate at a negative bias potential in the first plasma, and performing anisotropic etching with the first plasma on the silicon layer through the opening of the mask layer to form a recess in the silicon layer; and
    a second step of alternately repeating an organic film forming process and an etching process, wherein
        the organic film forming process includes generating a second plasma, which is used to form an organic film that is removable with the first plasma, maintaining the substrate at a negative bias potential in the second plasma, and depositing the organic film on an inner surface of the recess with the second plasma, and
        the etching process includes generating the first plasma from the gas mixture, maintaining the substrate at a negative bias potential in the first plasma, and performing the anisotropic etching with the first plasma on the recess covered by the organic film through the opening of the mask layer;
    wherein the first step is shifted to the second step when the etching stopper layer is exposed from part of a bottom surface of the recess formed by the first step.

2. The method according to claim 1, wherein the second step includes alternately repeating the organic film forming process with the second plasma and the etching process with the first plasma for a number of times.

3. The method according to claim 1, wherein the first step includes detecting exposure of the etching stopper layer from part of the bottom surface of the recess based on a change in the amount of an etching product produced when etching the silicon layer.

4. The method according to claim 3, wherein the first step includes monitoring the amount of the etching product and detecting the exposure of the etching stopper layer from part of the bottom surface of the recess when the amount of the etching product decreases.

5. The method according to claim 1, wherein the first step includes monitoring the amount of an etchant, which etches the silicon layer, and detecting exposure of the etching stopper layer from part of the bottom surface of the recess when the amount of the etchant increases.

6. The method according to of claim 1, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

7. The method according to claim 2, wherein the first step includes detecting exposure of the etching stopper layer from part of the bottom surface of the recess based on a change in the amount of an etching product produced when etching the silicon layer.

8. The method according to claim 7, wherein the first step includes monitoring the amount of the etching product and detecting the exposure of the etching stopper layer from part of the bottom surface of the recess when the amount of the etching product decreases.

9. The method according to claim 8, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

10. The method according to claim 2, wherein the first step includes monitoring the amount of an etchant, which etches the silicon layer, and detecting exposure of the etching stopper layer from part of the bottom surface of the recess when the amount of the etchant increases.

11. The method according to claim 10, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

12. The method according to claim 2, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

13. The method according to claim 3, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

14. The method for performing dry etching according to claim 4, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

15. The method according to claim 5, wherein
    the gas mixture includes a sulfur hexafluoride gas serving as the fluorine containing gas, an oxygen gas serving as the oxidation gas, and a hydrogen bromide gas;
    the second plasma is generated from a carbon fluoride compound; and
    the organic film is formed as a polymer of the carbon fluoride compound.

* * * * *